(12) United States Patent
Olson

(10) Patent No.: US 8,952,354 B2
(45) Date of Patent: Feb. 10, 2015

(54) MULTI-JUNCTION PHOTOVOLTAIC CELL WITH NANOWIRES

(75) Inventor: Jerry M. Olson, Lakewood, CO (US)

(73) Assignee: Sol Voltaics AB, Lund (SE)

( * ) Notice: Subject to any disclaimer, the term of this patent is extended or adjusted under 35 U.S.C. 154(b) by 788 days.

(21) Appl. No.: 13/264,444

(22) PCT Filed: Apr. 13, 2010

(86) PCT No.: PCT/SE2010/050396
§ 371 (c)(1),
(2), (4) Date: Oct. 14, 2011

(87) PCT Pub. No.: WO2010/120233
PCT Pub. Date: Oct. 21, 2010

(65) Prior Publication Data
US 2012/0032148 A1 Feb. 9, 2012

(30) Foreign Application Priority Data
Apr. 15, 2009 (SE) ..................................... 0950244

(51) Int. Cl.
*H01L 31/0352* (2006.01)
*B82Y 15/00* (2011.01)
(Continued)

(52) U.S. Cl.
CPC ...... *H01L 31/03529* (2013.01); *H01L 27/1422* (2013.01); *H01L 31/061* (2013.01); *H01L 31/0687* (2013.01); *H01L 31/0693* (2013.01); *H01L 31/0725* (2013.01); *H01L 31/078* (2013.01); *Y02E 10/544* (2013.01);
(Continued)

(58) Field of Classification Search
CPC ............ H01L 27/1422; H01L 29/0676; H01L 29/068; H01L 31/0352; H01L 31/035281; H01L 31/03529; H01L 31/02167; H01L 31/022425; H01L 31/0687; H01L 31/0725; H01L 31/072
See application file for complete search history.

(56) References Cited

U.S. PATENT DOCUMENTS

| 4,234,352 A | 11/1980 | Swanson |
| 7,335,908 B2 | 2/2008 | Samuelson et al. |

(Continued)

FOREIGN PATENT DOCUMENTS

| EP | 1944811 A2 | 7/2008 |
| WO | 2007/102781 A1 | 9/2007 |
| WO | 2008/156421 A2 | 12/2008 |

OTHER PUBLICATIONS

International Search Authority/European Patent Office (ISA/EP). International Search Report, PCT Application PCT/SE10/50396. Jul. 13, 2010.

(Continued)

*Primary Examiner* — Shaun Campbell
*Assistant Examiner* — Raj R Gupta
(74) *Attorney, Agent, or Firm* — The Marbury Law Group PLLC

(57) ABSTRACT

A multi junction photovoltaic cell for converting light into electrical energy, comprising a substrate (3) having a surface (31), wherein a region (4) at the surface (31) of the substrate (3) is doped such that a first p-n junction is formed in the substrate (3). The photovoltaic cell has a nanowire (2) that is arranged on the surface (31) of the substrate (3) at a position where the doped region (4) is located in the substrate (3), such that a second p-n junction is formed at the nanowire (2) and in series connection with the first p-n junction.

14 Claims, 6 Drawing Sheets

(51) Int. Cl.
  *H01L 27/142* (2014.01)
  *H01L 31/061* (2012.01)
  *H01L 31/0687* (2012.01)
  *H01L 31/0693* (2012.01)
  *H01L 31/0725* (2012.01)
  *H01L 31/078* (2012.01)

(52) U.S. Cl.
  CPC ........... *Y10S977/762* (2013.01); *Y10S 977/948* (2013.01); *Y10S 977/954* (2013.01)
  USPC .................. 257/21; 257/9; 977/762; 977/948; 977/954

(56) References Cited

U.S. PATENT DOCUMENTS

2005/0064185 A1* 3/2005 Buretea et al. ................ 428/364
2008/0169017 A1 7/2008 Korevaar et al.
2010/0154861 A1* 6/2010 Gritters ........................ 136/246
2011/0033969 A1† 2/2011 Chaudhari
2011/0269264 A1* 11/2011 Korevaar et al. ................ 438/98

OTHER PUBLICATIONS

International Search Authority/European Patent Office (ISA/EP). Written Opinion of the International Search Authority, PCT Application PCT/SE10/50396. Jul. 13, 2010.
International Bureau of WIPO. International Preliminary Report on Patentability, PCT Application PCT/SE10/50396. Oct. 18, 2011.
Praveen Chaudhari, et al., Heteroepitaxial silicon film growth at 600° C from an Al-Si eutectic melt, 5368-5371, Jul. 30, 2010, Thin Solid Films.†

\* cited by examiner
† cited by third party

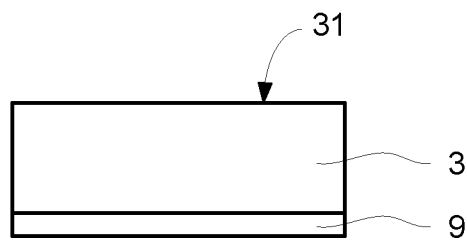
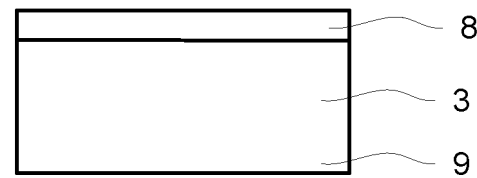
*Fig. 8a*  *Fig. 8b*
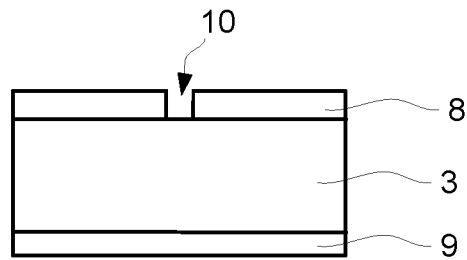
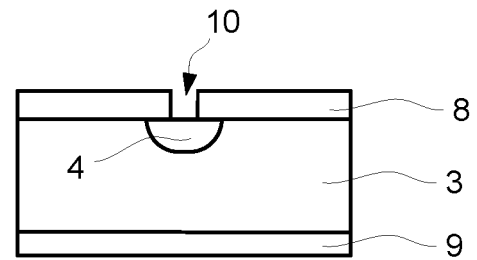
*Fig. 8c*  *Fig. 8d*
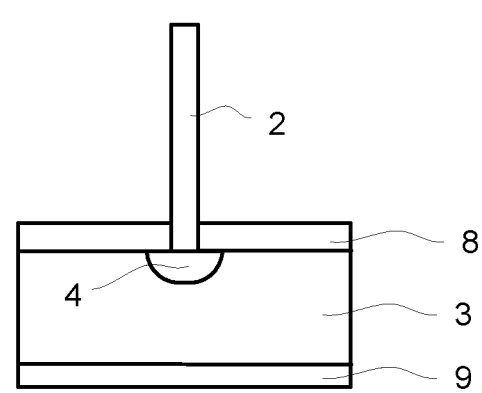
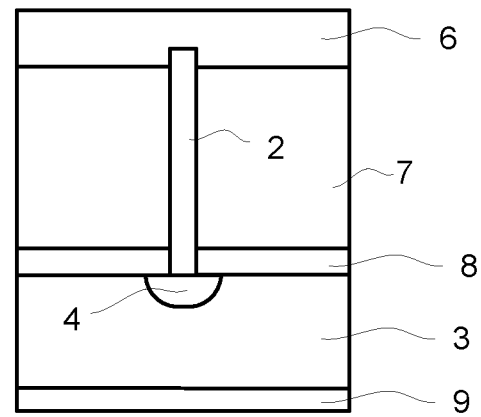
*Fig. 8e*  *Fig. 8f*

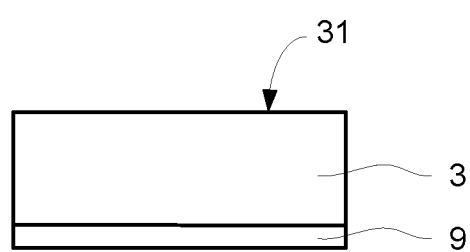
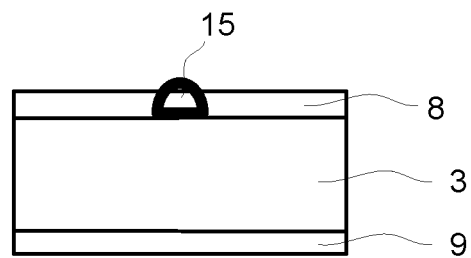
Fig. 9a  Fig. 9b
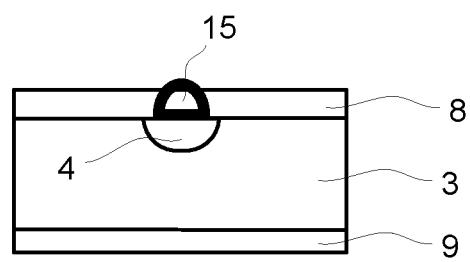
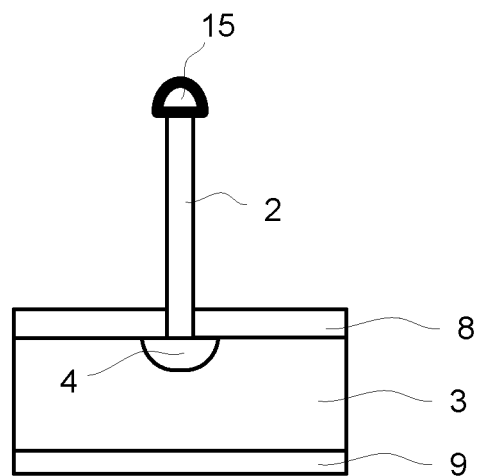
Fig. 9c  Fig. 9d
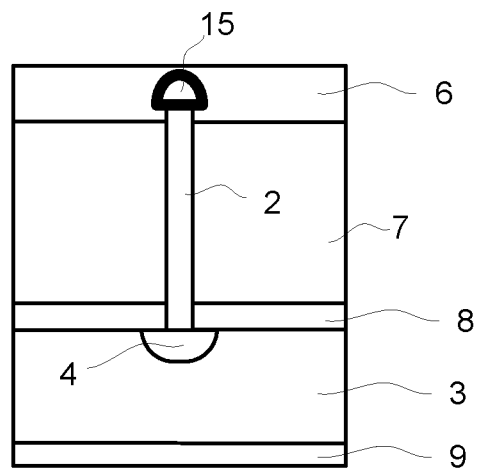
Fig. 9e

MULTI-JUNCTION PHOTOVOLTAIC CELL WITH NANOWIRES

CROSS-REFERENCE TO OTHER APPLICATIONS

This application is a national phase application under 35 U.S.C. §371 of international application PCT/SE2010/050396 (filed Oct. 15, 2010) which claims priority to Swedish Application 0950244-4 (filed Apr. 15, 2009).

TECHNICAL FIELD

The invention relates to a photovoltaic cell that includes a nanowire as an active component.

BACKGROUND ART

The interest in solar cell technology has increased over the last years as energy prices steadily reach higher levels and as the drawbacks of using fossil fuel becomes more and more obvious. Moreover, technology breakthroughs imply that large scale production of high efficiency photovoltaic (solar) cells is possible.

For example, rectifying junctions, such as p-n junctions and Schottky diodes, are fabricated in semiconducting materials to make photovoltaic cells that are used in solar cell devices as well as in photodetectors. A photovoltaic cell converts light into electricity as light illuminates the p-n junction and creates pairs of oppositely charged particles: electrons and holes. These charges are separated by the rectifying junction to produce an electrical current. Photodetectors work on a similar principle.

Conventional photovoltaic cells are often planar devices constructed of at least two asymmetrically doped semiconductor layers with front and back contacts. For a conventional photovoltaic cell, light enters between a grid formed by front contacts where it is absorbed by the n-type layer and p-type layer creating electron-hole pairs. The electron-hole pairs are separated by a p-n junction and a voltage develops across the photovoltaic cell. Useful power is obtained by putting a load across the cell contacts and hence photovoltaic cells convert radiation directly into useful electric energy.

One factor that limits the conversion efficiency from light to electricity is reverse current leakage across the p-n junction. For a planar cell, reverse current leakage increases as the area of the p-n junction increases.

There are many ways to reduce undesirable reverse current leakage for a planar cell but whatever methods are used, reduction of reverse current leakage is limited by the area of the p-n junction, and for a planar cell reducing the area simply means the cell is smaller and thus collects less light. By using a different cell geometry (nonplanar) it is possible to reduce the area of the p-n junction without reducing the total area of the cell.

One successful non-planar geometry is the silicon dot-junction photovoltaic cell which is described in e.g. U.S. Pat. No. 4,234,352. In this patent a dot-junction cell is disclosed, where one surface of a silicon substrate has a series of locally doped n+ regions and p+ regions (dot junctions), such that the area of the doped regions is much less than the total area of the dot-junction cell. The p+ regions form the p-n junction with a bulk, and the n+ regions form areas of low resistivity for n-type contacts.

However, even if reverse current leakage is limited, the efficiency of the dot-junction cell is still not optimal. For example, since each dot-junction is a single band gap solar cell, efficiency is limited due to the inability to efficiently convert the broad range of energy that photons possess in the solar spectrum. In the ideal limit, only photons with energy equal to the band gap energy are efficiently converted to electricity. Photons below the band gap of the cell material are lost; they either pass through the cell or are converted to only heat within the material. The energy in the photons in excess of the band gap energy is also lost to heat due to carrier relaxation to the band edges.

Accordingly, even if a dot-junction photovoltaic cell is advantageous with respect to a reduced reverse current leakage, a dot junction solar cell still has a disadvantage in terms of photon energy efficiency, i.e. a large portion of the solar spectrum is lost to heat and not converted into electricity. Further background art is reflected by patent document EP1944811.

SUMMARY

In view of the foregoing, it is an object of the invention to provide an improvement of the above techniques and prior art. More particularly, it is an object to improve a dot-junction photovoltaic cell such that the photovoltaic cell more efficiently converts light into electricity.

Hence a multi-junction photovoltaic cell for converting light into electrical energy is provided. The photovoltaic cell comprises a substrate having a surface, wherein a region at the surface of the substrate is doped such that a first p-n junction is formed in the substrate. The photovoltaic cell has a nanowire that is arranged on the surface of the substrate at a position where the doped region is located in the substrate, such that a second p-n junction is formed at the nanowire and in series connection with the first p-n junction. The meaning of p-n junction formed "at" the nanowire includes the possibility that both the p-type and n-type parts of the p-n junction are formed in the nanowire, or that the nanowire includes only one of the p-type and n-type parts of the p-n junction while the other part of the junction is formed in the substrate at the doped region or at any other part of the photovoltaic cell, e.g. at a contact in connection with the nanowire.

Since the nanowire is arranged on the surface of the substrate it may instead be said that the nanowire is grown from the surface of the substrate, or located on or at the surface of the substrate.

The inventive photovoltaic cell is advantageous in that each of the two p-n junctions (diodes) may have a respective characteristic band gap energy for absorbing light over a respective portion of the spectrum. The two p-n junctions are chosen to, in combination, absorb as much of the solar spectrum as possible, thus generating electricity from as much of the solar energy as possible which increases the efficiency of the solar cell. In brief, by virtue of the nanowire being arranged at the doped region in the substrate, the second p-n junction is arranged close to the first p-n junction and the resulting photovoltaic cell thus employs the principles and advantages of a so called multi-junction photovoltaic cell.

Moreover, since a nanowire is used for forming the second p-n junction additional advantages are achieved. These include, for example and in comparison with a traditional planar III-V multi-junction solar cell, a possibility to achieve higher efficiency values since it is more easy to arrange more p-n junction elements in a nanowire, a reduced need of perfect lattice matching over large substrate areas for purpose of avoiding dislocations, and an improved functionality since it is more easy to obtain a high degree of compositional homogeneity.

Typically, the first p-n junction is a point contact photodiode while the second p-n junction is an axial photodiode or a radial photodiode. It should also be noted that the nanowire may be very short such that is has a more stump-like rather than an elongated structure. However, even if the nanowire may be very short, it is grown in the same way as a longer nanowire apart from different time values for the nucleation (growth) time.

Typically, it can be said that the substrate may comprise differently doped parts, where one part comprises the doped region while the remaining part is not doped or doped in a different way than the doped region. The functional difference between the doped region and remaining parts of the substrates may lie in that the region is doped such that it forms the first p-n junction in the substrate. Thus the doped region can be differentiated by its doping and in that the p-n junction is formed.

The exact size of the doped region is not relevant for the principle behind the multi-junction photovoltaic cell as long as the first p-n junction can be formed. However, the size of the doped region may typically be less than 900 nanometers. More specifically, the size of the doped region may be within the range of e.g. 100 to 300 nanometers, and the size can refer to the diameter of the doped region or to its depth as seen from the surface of the substrate.

The second p-n junction may be formed in the nanowire, i.e. the nanowire may be configured to comprise the second p-n junction, which means that the nanowire can comprise the second junction, i.e. comprises both the p-type and n-type part of the junction, which provides a high degree of flexibility when growing the nanowire and arranging the wire in a relationship to the substrate or an electrical contact.

The doped region may be formed by any one of ion implantation, dopant diffusion, heteroepitaxy and homoepitaxy, which provides for flexible manufacturing of a substrate with doped regions at its surface.

The nanowire may be in direct contact with the doped region and more specifically, the nanowire may be grown on (i.e. may be "arranged on") the doped region. This is quite advantageous in that it may be assured that the efficiency of the photovoltaic cell is increased, which is based on the understanding that a portion of the light spectrum not absorbed at the second p-n junction may be absorbed by the first p-n junction. Preferably, the p-n junctions are configured such that light with a shorter wavelength is absorbed by the second (upper) p-n junction while light with a relatively longer wavelength is absorbed by the first (lower) p-n junction.

The nanowire may be in epitaxial relationship with the doped region, which provides for better adaptation of a bandgap configuration of the two p-n junctions for the purpose of increasing the efficiency of the solar cell.

The multi-junction photovoltaic cell may comprise a third p-n junction that is arranged between the first p-n junction and the second p-n junction. The third p-n junction is preferably a tunnel diode (Esaki diode) that is formed during the process of growing the nanowire and serves the purpose of establishing an electrical connection between the first and second p-n junctions. Instead of or as a complement to the third p-n junction, the multi-junction photovoltaic cell may comprise a metallically conductive connection element arranged between the first p-n junction and the second p-n junction, for connecting the first and second p-n junctions in series.

The nanowire may be surrounded by a shell that is tapered along a normal direction of the surface, which shell is doped such that a p-n junction is formed between the shell and the nanowire. This allows for optimization of the aspect ratio of the shell such that larger or smaller amounts of high-energy light will be able to pass the nanowire structure (including the shell) and reach the first p-n junction that is formed in the substrate. In this particular embodiment, this gives a more efficient multi-junction photovoltaic cell since the first (bottom) cell might otherwise be starved for light, thus limiting the total current in the device.

The substrate may be made of a semiconductor material that consists of silicon or doped silicon, or germanium or doped germanium or optionally a silicon-germanium alloy. The nanowire may be made of a semiconductor material that comprises a group III-V semiconductor material, while a III-V material may be a diffusion source of dopant atoms into the substrate for creating the doped region. Each of these material choices, and in particular in combination, allows for a cost efficient manufacture of the multi-junction solar cell.

From above follows that the substrate may comprise a III-V material acting as dopant atoms for creating the doped region(s).

The multi-junction photovoltaic cell may be configured to be arranged with the surface of the substrate facing a source of light. This means that the doped region of the surface, i.e. the point-contact diode, is arranged on the side of the substrate that is intended to face the light when the photovoltaic cell is in operation. This is different from many known point-contact solar cells and results in an efficient collaboration between the first and second p-n junctions when it comes to efficiently using the energy of the sun for producing electricity.

The multi-junction photovoltaic cell may comprise a plurality of regions at the surface of the substrate, each region being doped such that the regions form a respective first p-n junction in the substrate, wherein a plurality of nanowires are grown from (i.e. "arranged on") the surface of the substrate, each nanowire at a position of a respective doped region, such that each nanowire forms a second p-n junction in series connection with a respective first p-n junction.

Here, a plurality means more than one, but may in practice be at least $1 \times 10^4$ mm$^{-2}$ pairs of doped regions and nanowires, i.e. pairs of first and second p-n junctions, are formed on the substrate.

When the multi-junction photovoltaic cell comprises a plurality of regions at the surface of the substrate, then each region is doped such that the regions form a respective first p-n junction in the substrate, and a plurality of nanowires are grown from (i.e. "arranged on") the surface of the substrate. Each nanowire is then arranged at a position of a respective doped region, such that each nanowire forms a second p-n junction in series connection with a respective first p-n junction. In the case of multiple doped regions and nanowires, the various features described above can be implemented for several or all of the doped regions and nanowires, as applicable.

BRIEF DESCRIPTION OF THE DRAWINGS

Embodiments of the invention will now be described, by way of example, with reference to the accompanying schematic drawings, in which FIGS. 8a-8f illustrate how the solar cell structure is manufactured according to a first embodiment, and FIGS. 9a-9e illustrate how the solar cell structure is manufactured according to a second embodiment.

DETAILED DESCRIPTION OF PREFERRED EMBODIMENTS

Figure 1:
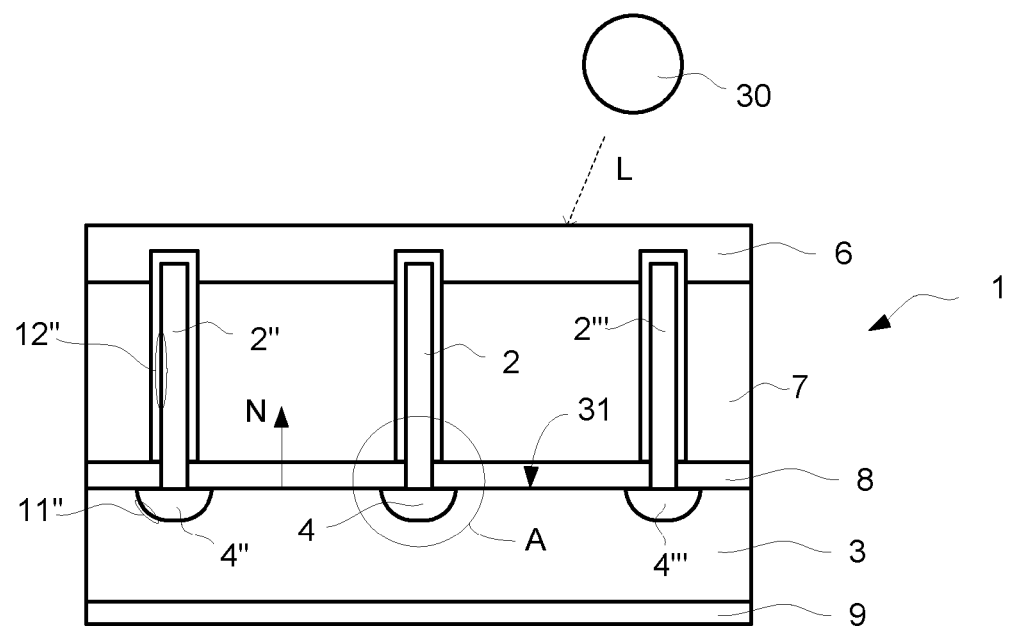
FIG. 1 illustrates a multi-junction solar cell according to the invention.

With reference to FIG. 1 a multi-junction photovoltaic (solar) cell 1 comprises a planar substrate 3 made of p-doped Si (silicon). The substrate 3 has an upper surface 31 intended to face light L that is incident on the solar cell 1, i.e. the upper surface 31 is the upper, front side of the substrate 3. A planar back contact 9 made of e.g. Al (aluminum) is arranged on the lower surface of the substrate 3 opposite the upper surface 31. In the upper surface 31 of the substrate 3 an n-doped region 4 is located. This region 4 is dome-shaped with the planar part of the region 4 being aligned with a plane formed by the upper surface 31. Accordingly, the curved part of the dome shaped region 4 extends into the substrate 3. However, the extent of the region 4 is smaller than the total thickness of the substrate 3. A nanowire 2 is located on the substrate 3 at the center position of the doped region 4. This means that a geometrical axis defined by the longitudinal direction of the nanowire 2 extends through the centre of the doped region 4, or, in other words, the nanowire 2 is arranged on top of the doped region 4 as seen from a normal direction N of the surface 31.

Preferably, the nanowire 2 is parallel with the normal direction N of the surface 31 but may also be arranged in an inclined relationship with the normal direction N.

The upper surface 31 of the substrate 3 may be covered with an insulating layer 8 of $SiO_2$ (silicon dioxide), while the nanowire 2 protrudes through the layer 8 and thus establishes electrical contact with the substrate 3. Other materials for the insulating layer 8 include $Si_xN_y$, $Al_xO_y$, $HfO_2$ and $SiO_xN_y$.

The nanowire 2 is embedded in a supporting, insulating layer 7 which provides a support for the nanowire 2. The support 7 is arranged on top of the insulating layer 8 and is in this particular embodiment made of an insulating and passivating dielectric material such as $Si_xN_y$, $Al_xO_y$, $HfO_2$, $SiO_xN_y$, a polymer, borophosphosilicate glass or spin-on-glass etc. Optionally, the nanowire is surrounded by air.

The supporting layer 7 is in turn covered by a TCO 6 (transparent and conductive oxide layer) which is in electrical contact with the nanowire 2 since the nanowire 2 protrudes with its uppermost part into the TCO 6. The layer 6 may alternatively consist of a conducting polymer or any other transparent conductor. Even though not illustrated, a thin metal layer may be arranged between the nanowire and the TCO, for making an Ohmic contact to the nanowire. The TCO 6 and the back contact 9 are in turn configured to be connected to electrical devices (not shown) that use electricity generated by the multi-junction solar cell 1.

Figure 2:
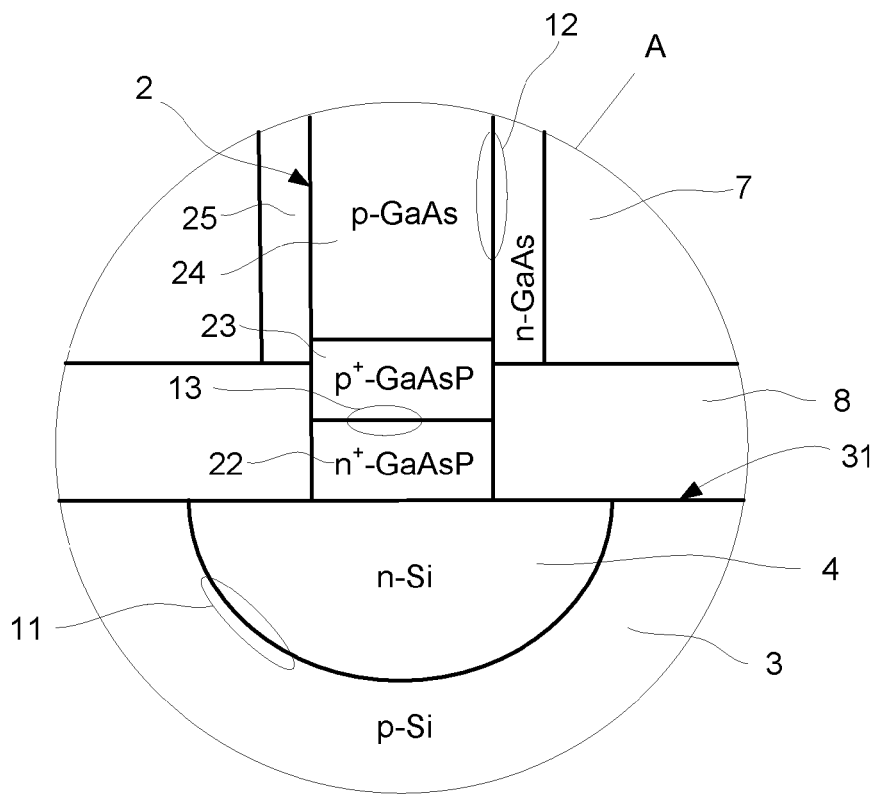
FIG. 2 is a partial view of the solar cell of FIG. 1, FIGS. 3-7 are partial views similar to the view of FIG. 2, but illustrates other embodiments of the solar cell.

With further reference to FIG. 2, the part of the multi-junction solar cell 1 indicated by A in FIG. 1 is illustrated in enlarged detail. Here the p-doped substrate 3 and the n-doped region 4 form a first p-n junction 11, i.e. a point contact diode. Of course, the first p-n junction 11 is formed by the complete surface forming the boundary between the p-doped Si of the substrate 6 and n-doped Si of the doped region 4; not only the part illustrated by reference numeral 11.

On the doped region 4 the nanowire 2 is grown, or located, and the lowest part 22 of the nanowire 2 is made of $n^+$-doped GaAsP (Gallium arsenide phosphide). A part of the nanowire 2 above the $n^+$-doped GaAsP-part 22 forms an intermediate part 23 of the nanowire 2 and is also made of GaAsP but is $p^+$-doped instead of $n^+$-doped. This means that a heavily doped ($p^+$-$n^+$) junction 13 is formed between the lower 22 and the intermediate 23 part of the nanowire 2, which junction 13 typically forms a tunnel diode.

A part of the nanowire 2 above the intermediate nanowire part 23 forms an upper part 24 of the nanowire 2. This part 24 is p-doped and made of, for example, GaAs (Gallium arsenide) and is enclosed by a layer 25 of n-doped GaAs that extends from the insulating layer 8 to the top of the nanowire 2. Here the p-doped upper nanowire part 24 and n-doped enclosing layer 25 form a second p-n junction 12, i.e. a so called radial diode that extends along the circumferential surface of the upper p-doped GaAs nanowire part 24 that is in contact with the n-doped GaAs layer 25.

The previously described heavily doped junction 13 formed between the lower 22 and the intermediate 23 part of the nanowire 2 is referred to as "a third p-n junction" 13 and forms a so called tunnel diode that establishes an electrical connection between the first p-n junction 11 and the second p-n junction 12.

Figure 3:
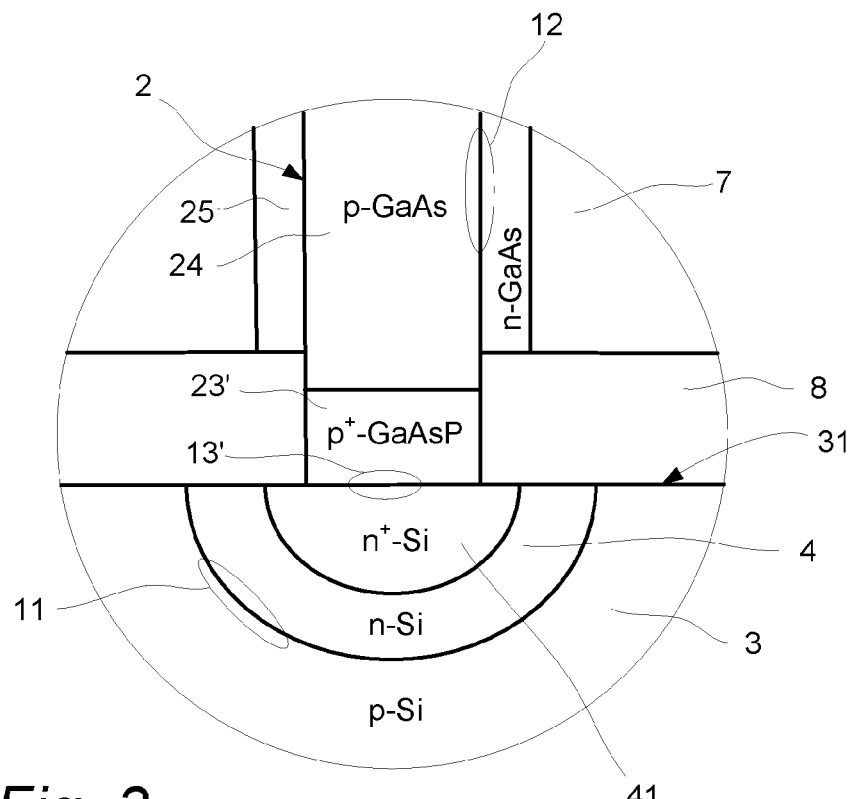

With reference to FIG. 3, another embodiment of a multi-junction solar cell is illustrated in enlarged detail. Here, in comparison with the embodiment of FIG. 2, the n-doped Si region 4 comprises a heavily doped ($n^+$) Si region 41 with a shape corresponding to the shape of the doped region 4 but with smaller geometrical dimensions, as may be seen in FIG. 3. Moreover, the $n^+$-doped GaAsP nanowire part 22 of FIG. 2 is omitted such that a $p^+$-doped GaAsP nanowire part 23' is grown on the $n^+$-Si region 41. This means that a $p^+$-$n^+$ junction 13' is located at the interface between the nanowire 2 and the substrate 3. The junction 13' of FIG. 3 functionally corresponds to the junction 13 of FIG. 2, while the junctions 11 and 12 are the same in both embodiments.

Figure 4:
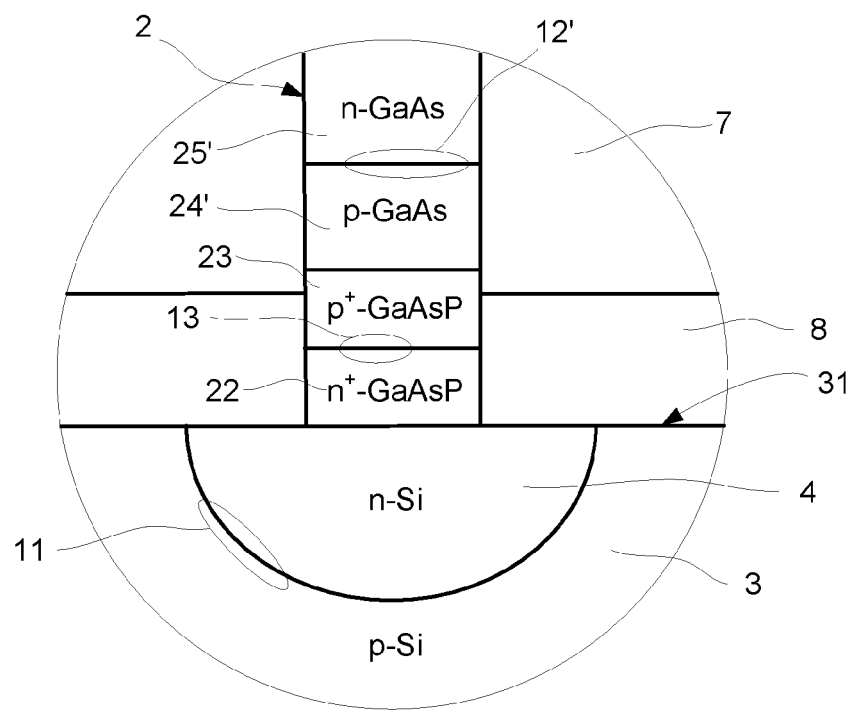

With reference to FIG. 4, a further embodiment of a multi-junction solar cell is illustrated in enlarged detail. Here, in comparison with the embodiment of FIG. 2, the n-doped enclosing GaAs layer 25 is functionally replaced by an uppermost n-doped GaAs part 25' of the nanowire 2. This uppermost part 25' is on top of a p-doped GaAs part 24' of the nanowire 2 that in turn is arranged on top of the previously described intermediate $p^+$-GaAsP part 23 of the nanowire 2. The p-doped GaAs part 24' of FIG. 4 corresponds to the p-doped GaAs part 24 of FIG. 4, which means that a p-n junction 12' is formed between the uppermost part 25' and the part 24'. This junction 12' forms a p-n diode that corresponds to the junction 12 of FIG. 2, while the junctions 11 and 13 are the same in the embodiments of FIG. 2 and FIG. 4.

Figure 5:
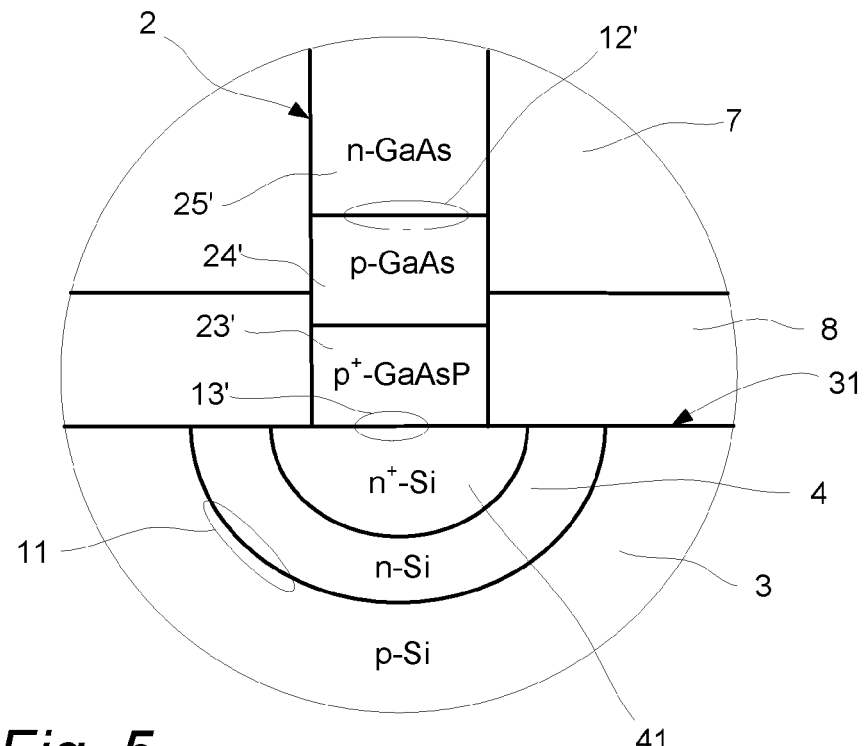

With reference to FIG. 5, yet another embodiment of a multi-junction solar cell is illustrated in enlarged detail. Here, in comparison with the embodiment of FIG. 4, the n-doped Si region 4 comprises a heavily doped ($n^+$) Si region 41 with a shape corresponding to the shape of the doped region 4 but with smaller geometrical dimensions, as may be seen in FIG. 5. Moreover, the $n^+$-doped GaAsP nanowire part 22 of FIG. 4 is omitted such that a $p^+$-doped GaAsP nanowire part 23' is grown on the $n^+$-Si region 41. This $p^+$-doped GaAsP part 23' functionally corresponds to the $p^+$-doped GaAsP part 23 of FIG. 4. Accordingly, a $p^+$-$n^+$ junction 13' is located at the interface between the nanowire 2 and the substrate 3. The junction 13' of FIG. 5 functionally corresponds to the junction 13 of FIG. 2 or FIG. 4, while the junction 12' of FIG. 4 is the same as the junction 12' of FIG. 5.

Figure 6:
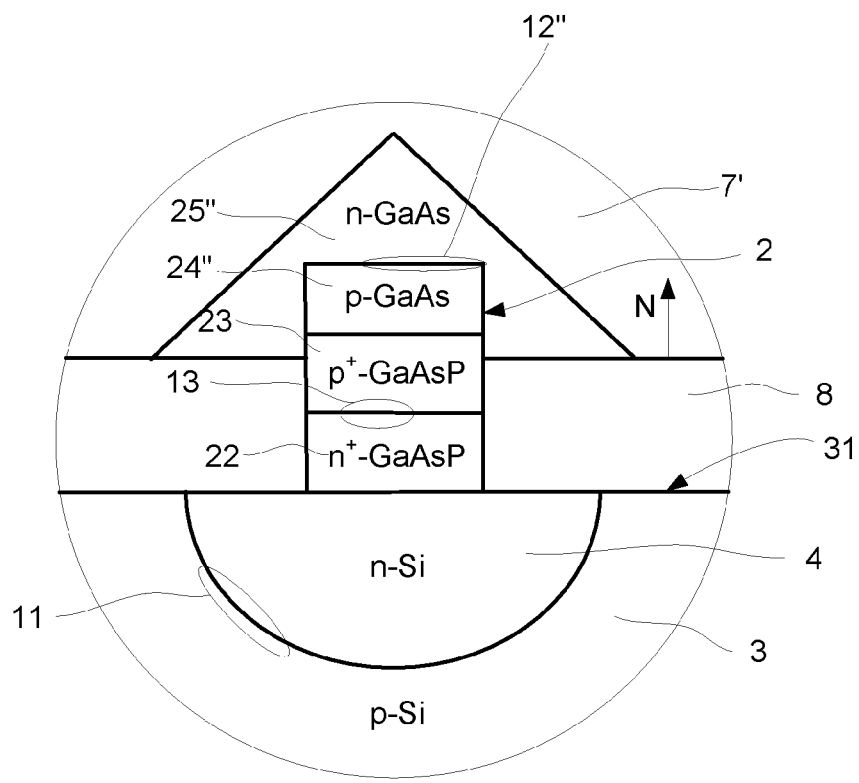

With reference to FIG. 6, a further embodiment of a multi-junction solar cell is illustrated. It is similar with the embodiment of FIG. 2 but for i) the uppermost, p-doped part of the nanowire which forms only a short stump 24'', ii) the enclosing layer 25'', or shell, which has a conical shape and iii) the supporting, layer 7' which here is a TCO layer. Here the p-doped upper nanowire part 24'' and n-doped enclosing shell 25" form a second p-n junction 12", which is a form of radial diode that extends along the circumferential surface of the upper p-doped GaAs nanowire part 24" that is in contact with the n-doped GaAs layer 25".

Figure 7:
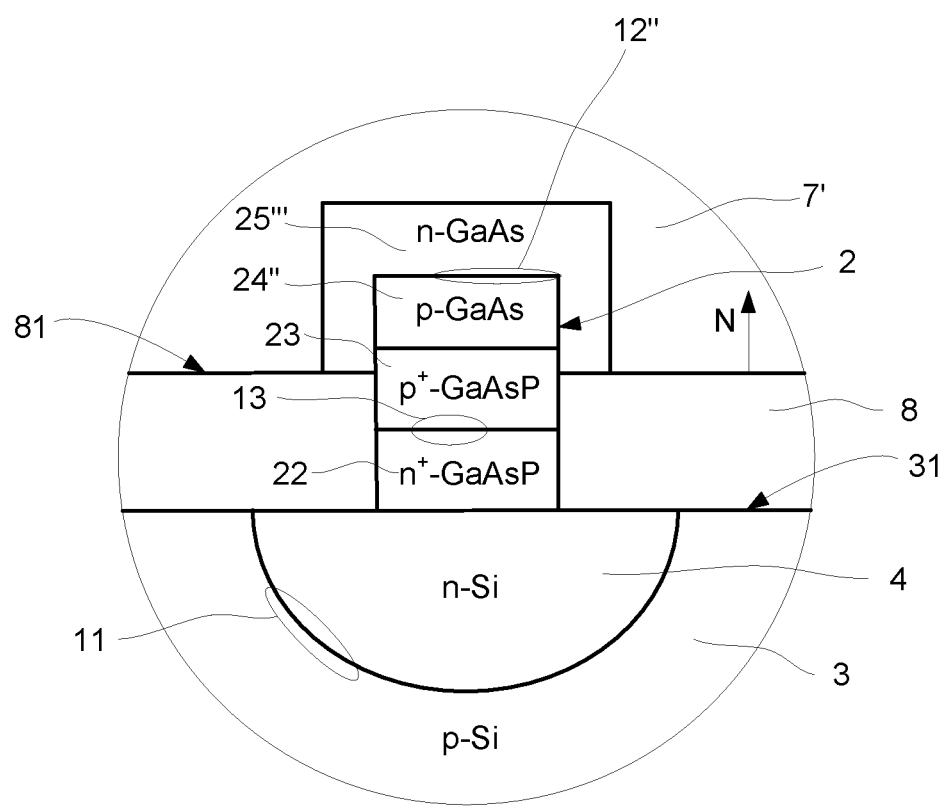

Instead of a conical shape of the nanowire enclosing layer, as in the embodiment of FIG. 6, the enclosing layer may have the shape of a pyramid or a cylinder 25''', which in the latter case is illustrated in FIG. 7. However, in this embodiment as with the embodiment of FIG. 6, the nanowire 2 forms a stump that extends a relatively short distance above an upper surface 81 of the insulating layer 8.

This distance, or height above the insulating layer surface 81, is preferably less than ten times the width (or diameter) of the nanowire, or more preferably less than five times or even more preferably less than two times the width of the nanowire. In comparison with known nanowires, the nanowires of the embodiments of FIGS. 6 and 7 are quite short and thus the area of the p-n junction 12" formed between the nanowire and the enclosing layer is relatively small, which results in a reduced reverse current leakage across the p-n junction.

It should be noted that for all embodiments the nanowire may have a prismatic cross-sectional shape with three or more facets. The same applies for the nanowire enclosing layers.

During operation, the multi-junction solar cell 1 is arranged such that its front side faces the sun or another source of light 30, e.g. an indoor lamp, which photo energy shall be used for producing electricity. Once the solar cell 1 is properly arranged the normal N of the surface 31 of the substrate 3 is directed towards the source of light 30 such that a ray of light L is incident on the solar cell 1 at an angle in relationship with the normal N.

The nanowire 2 is epitaxially grown on the substrate 3 and the first and the second p-n junctions 11, 12, 12' are each tuned to absorb a specific band of the light from the sun. The band gap of the substrate 3 along with the doped region 4 and the nanowire parts 24, 25, 24', 25' are optimized according to conventional and suitable processes and in relation to each other. Due to the limited thickness of the wires, lattice matching is not always required at the junction between the substrate and the wire or in any vertical junction in the wire.

The first junction 11 and the second junction 12, 12' are optically in series, with the highest band gap material at the top. In the direction of travelling light, the uppermost, second p-n junction 12, 12' receives the entire spectrum and photons above the band gap of the second p-n junction 12, 12' are absorbed at this junction 12, 12'. Photons below the band gap of the second junction 12, 12' pass through to the lower, first p-n junction 11 to be absorbed there. Here, an "upper" junction means that the junction is closer to the TCO 6 than a "lower" junction.

Some typical values for band gaps ($E_g$) for the specific materials in the embodiments include, in case of a Si substrate, a wire that has $E_g$=1.69 eV, which approximately correspond to $GaAs_{0.8}P_{0.2}$ (theoretical efficiency 48%). In case of a Ge (germanium) substrate, a wire may have $E_g$=1.43 eV, approximately corresponding to GaAs (theoretical efficiency 48%). Material in a bottom part of the wire has a value of 0.2 eV higher than rest of wire. In practice however, any band gap between that of Si (1.1 eV) and 2.0 eV may be sufficient for a Si substrate and any band gap between that of Ge (0.67 eV) and 1.7 eV for a Ge substrate.

The solar cell 1 utilizes tandem electrical connection which means that the p-n-junctions 11, 12 alt. 12' or 12", 13 alt. 13' are electrically connected in series and that the combined cell 1 has two terminals, i.e. the TCO 6 (alt. 7' in case of the embodiment of FIG. 6 or 7) and the planar back contact 9. Since the p-n junctions 11, 12 alt. 12' or 12", 13 alt. 13' are in series connection, an electrical current through each junction 11, 12 alt. 12' or 12", 13 alt. 13' is the same. Hence the bandgaps of the first and second junctions 11, 12 alt. 12' or 12" are, as mentioned, optimized such that the maximum power point current of these junctions 11, 12 alt. 12' or 12" is the same, for avoiding reduced efficiency. Alternatively, the effective light absorption of second (top) junctions is reduced to achieve current matching also for non-optimal bandgap combinations. The third junction 13, 13' serves as a connector between the first and second junctions 11, 12, 12', 12".

As indicated, the corresponding situation applies for the p-n junctions of the embodiments of FIGS. 3-7.

More specifically, the substrate 3 is made of a conventional p-doped Si-wafer that has been provided with an n-doped region by making use of ion implantation, dopant diffusion, by diffusion during heteroepitaxial growth, or any other conventional and suitable process.

With reference to FIGS. 8a-8f a method of manufacturing the solar cell 1 of FIG. 2 is exemplified. Here the back contact 9 is attached (FIG. 8a) to the substrate 3, which is done either before or after nanowire growth, according any known method suitable within the art. Next the upper surface 31 of the p-doped substrate 3 is covered with a dielectric layer 8 (FIG. 8b). This layer 8 is then patterned to form a hole 10 in the layer 8 with a diameter of 20 to 200 nanometers (FIG. 8c). The hole 10 exposes the underlying substrate 3 to a group V source gas allowing a small n-doped region 4 to form, centered on the hole 10 (FIG. 8d). In detail, once the hole 10 is formed the exposed (by the hole 10) part of the substrate 3 is n-doped with a group V material such as P (phosphorus) or As (arsenic) by using a diffusant doping process such that the diffused region 4 has a diameter of e.g. about 100 to 300 nanometers. It is also possible to perform the diffusion doping of the substrate during the below described heteroepitaxial growth of the nanowire 2, i.e., without need of a separate diffusion step. Described above is the preferred method of doping; there are many alternative known methods of doping semiconductors, e.g. ion implantation, which may be used if more suitable. The doped region 4 that is thus formed typically has an excess carrier concentration of approximately $1 \times 10^{16}$ cm$^3$ or greater.

Also the nanowire growth on the substrate 3 is guided by the hole 10 in dielectric template 8 provided on the surface 31. The dielectric template 8 covers the complete upper surface 31 of the substrate but for the hole 10 centered on the doped region 4, thereby exposing an area of the doped region 4. This hole 10 still has a diameter of 20 to 200 nanometers and guides the nanowire nucleation (growth) by increasing the probability of nucleation in the exposed area of the doped region 4. This area of increased probability of nucleation is referred to as nucleation onset position.

In further detail, the hole 10 acts as a dielectric template that defines the nucleation onset position for the nanowire growth, and an epitaxially grown, vertically standing nanowire 2 is formed (FIG. 8e), including any nanowire enclosing layer 25 or shell 25", 25''', on the doped region 4 of the substrate surface 31 such that it corresponds to a nanowire described in connection with the figures above.

Suitable methods for growing the nanowire 2 are known in the art and is for example shown in PCT application No. WO 2007/102781, incorporated by reference. From this it follows that the nanowire 2 may be grown from the doped region 4 of the substrate 3 by using other methods than the method described herein, without the use of a particle as a catalyst.

Once the nanowire 2 is grown all but a top part of the nanowire 2 is covered with the supporting layer 7, e.g. by using chemical vapor deposition plus back-etch to reveal wires. Finally the supporting layer 7 is covered, e.g. by sputtering, by the TCO 6 such that the uppermost part of the nanowire 2 is embedded in and is in electrical contact with the TCO 6 (FIG. 8*f*). Optionally the TCO replaces the supporting layer, in which case the TCO covers the nanowire.

As an alternative to the manufacturing method described above, a catalyst particle may be used in the process as illustrated in FIGS. 9*a*-9*e*.

Again the substrate 3 is a conventional p-doped Si-wafer where the Al-back contact 9 is attached (FIG. 9*a*) to the backside of the substrate 3, which, as mentioned, is done according to any known method suitable within the art and either before or after the nanowire growth. Next a catalytic particle 15 typically made from gold (Au) is placed on the upper surface 31 of the substrate 3, either by deposition through holes (10 in FIG. 8*c*) in an insulating dielectric layer 8, or by covering the upper surface 31 with an insulating dielectric layer 8. In either case, the particle 15 resides in a hole in the layer 8 such that a top of the particle 15 still is exposed, i.e. the particle 15 is not covered by the layer 8 (FIG. 9*b*). After this group III and V-containing compounds are allowed to decompose on the particle 15. The particle 15 then saturates with the growth species and due to a higher partial pressure and concentration under the particle 15 growth species diffuse into the substrate 3 at a region 4 under the particle (FIG. 9*c*). Growth species, times and temperatures for the diffusion are selected such that an n-doped, dome-shaped region 4 with a typical diameter of e.g. 300 nanometers is created under the particle 15.

After this the nanowire 2 is grown (FIG. 9*d*) by using the so-called VLS (vapor-liquid-solid) mechanism described in U.S. Pat. No. 7,335,908, hereby incorporated by reference, such that it corresponds to a nanowire described in connection with the figures above. The doping process described above may continue to some extent also during the growth of the nanowire 2, but with no difference in the final result.

As before, once the nanowire 2 is grown, all but the uppermost part of the nanowire 2, including the particle 15, is covered with the supporting layer 7. Finally the supporting layer 7 is covered by the TCO 6 such that the uppermost part of the nanowire 2 and the complete particle 15 are embedded in and thus in electrical contact with the TCO 6 (FIG. 9*e*).

For the solar cells illustrated in FIG. 3 and FIG. 5 the heavily doped (n$^+$) Si region 41 is made by using the same diffusant doping process as when creating the doped region 4, but instead using other process settings such that the doped region 41 has typically an excess carrier concentration of approximately $1 \times 10^{19}$ cm$^3$ or greater. For the solar cells illustrated in the figures the nanowire of each embodiment is grown by using any of the methods described above.

In practice, as illustrated in FIG. 1 several identical nanowires 2, 2", 2'" and corresponding doped regions 4, 4', 4" are simultaneously formed on the substrate 3, as common within the art. This results in a grass-like structure where a huge number of nanowires are arranged on and protrude form the surface 31 of the substrate 3. Typically, the doped regions are arranged at a distance from each other that is at least twice the diameter of the doped regions.

Of course, measurements, ranges and values indicated herein may be adapted to the specific needs and requirements of the solar cell, and, optionally, the doped part 25 and hence the p-n junction 12 may be substituted by a Schottky barrier.

The materials in the above description are intended as examples, and all of the above is in principle equally valid under any combination of the following substitutions: The silicon substrate material may be substituted for germanium or a $Si_xGe_{1-x}$ alloy. The wire material etc. is primarily chosen within the $In_{x-}Ga_{1-x}As_yP_{1-y}$ family of III-V semiconductors, but with possible partial substitution of Al and Sb as Group III and V, respectively, or by using the $In_xGa_{1-x}N$ family. The actual choice of materials will depend on detailed analyses and experiments, to achieve ideal band gaps, absorption and power conversion.

However, suitable materials for the substrate include, but are not limited to: Si, GaAs, GaP, GaP:Zn, GaAs, InAs, InP, GaN, Al2O3, SiC, Ge, GaSb, ZnO, InSb, SOI (silicon-on-insulator), CdS, ZnSe, CdTe.

Suitable materials for the nanowires and nanowire segments include, but are not limited to: AlGaInN, AlInP, BN, GaInP, GaAs, GaAs (p), GaAsP, GaA-IInP, GaN, GaP, GalnAs, GaInN, GaAIInP, GaAIInAsP, GalnSb, Ge, InGaP:Si, InGaP:Zn, InAs, InN, InP, InAsP, InSb, Si, ZnO. Possible donor dopants are Si, Sn, Te, Se, S, etc, and acceptor dopants are Zn, Fe, Mg, Be, Cd, etc. It should be noted that the nanowire technology makes it possible to use nitrides such as GaN, InN and AlN.

While this disclosure is described in the context of a photovoltaic cell it is expected to find use in other areas of optoelectronics, such as for photodetectors or light emitting diodes.

Although various embodiments of the invention have been described and shown, the invention is not restricted thereto, but may also be embodied in other ways within the scope of the subject-matter defined in the following claims. In particular, the polarity of each p-n junction may either be p-on-n or n-on-p (reversed), and more junctions may be included.

The invention claimed is:

1. A multi-junction photovoltaic cell for converting light into electrical energy, comprising a substrate having a surface and a dielectric layer comprising a plurality of holes, wherein a plurality of doped regions at the surface of the substrate are doped such that plurality of first p-n junction -are formed in the substrate wherein:
    each of said plurality of doped regions at the surface of the substrate is centered on the respective one of the plurality of holes,
    a plurality of nanowires are arranged on the surface of the substrate at respective positions where the respective doped regions are located in the substrate, such that a geometrical axis defined by a longitudinal direction of each of the plurality of the nanowires extends through the center of the respective one of the plurality of doped regions, and
    a plurality of second p-n junctions are formed at each of the plurality of the nanowires and in series connection with the each of the plurality of the first p-n junctions.

2. A multi-junction photovoltaic cell according to claim 1, wherein each of the plurality of the second p-n junctions is formed in the respective one of the plurality of nanowires.

3. A multi-junction photovoltaic cell according to claim 1, wherein each of the plurality of the doped regions is formed by any one of a heterojunction, ion implantation, dopant diffusion and homoepitaxy.

4. A multi-junction photovoltaic cell according to claim 1, wherein each of the plurality of nanowires is in direct contact with the doped region.

5. A multi junction photovoltaic cell according to claim 1, wherein each of the plurality of nanowires is grown on the doped region.

6. A multi-junction photovoltaic cell according to claim 1, wherein each of the plurality of nanowires is in epitaxial relationship with the doped region.

7. A multi-junction photovoltaic cell according to claim 1, wherein a third p-n junction is arranged between the first p-n junction and the second p-n junction in one of the plurality of nanowires.

8. A multi junction photovoltaic cell according to claim 1, wherein each of the plurality of nanowires is surrounded by a, in a normal direction (N) of the surface, tapered shell that is doped such that a p-n junction is formed between the shell and the respective nanowire.

9. A multi junction photovoltaic cell according to claim 1, wherein the substrate is made of a semiconductor material that consists of silicon or doped silicon.

10. A multi-junction photovoltaic cell according to claim 1, wherein the substrate is made of a semiconductor material that consists of germanium or doped germanium.

11. A multi junction photovoltaic cell according to claim 1, wherein each of the plurality of nanowires is made of a semiconductor material that comprises a group III-V semiconductor material.

12. A multi-junction photovoltaic cell according to claim 1, wherein a III-V material is a diffusion source of dopant atoms into the substrate, for creating the plurality of doped region.

13. A multi-junction photovoltaic cell according to claim 1, configured to be arranged with the surface of the substrate facing a source of light.

14. A multi junction photovoltaic cell according to claim 1, wherein said of the plurality of holes in the dielectric layer has a diameter of 20 to 200 nm.

\* \* \* \* \*